United States Patent [19]
Eichelberger et al.

[11] Patent Number: 4,714,516
[45] Date of Patent: Dec. 22, 1987

[54] METHOD TO PRODUCE VIA HOLES IN POLYMER DIELECTRICS FOR MULTIPLE ELECTRONIC CIRCUIT CHIP PACKAGING

[75] Inventors: Charles W. Eichelberger, Schenectady; Robert J. Wojnarowski, Ballston Lake, both of N.Y.

[73] Assignee: General Electric Company, Schenectady, N.Y.

[21] Appl. No.: 912,455

[22] Filed: Sep. 26, 1986

[51] Int. Cl.$^4$ ............... B44C 1/22; B29C 37/00; C03C 15/00; C03C 25/06
[52] U.S. Cl. ............... 156/628; 156/643; 156/644; 156/646; 156/655; 156/668; 204/192.36
[58] Field of Search ............... 427/53.1, 54.1, 38, 427/39, 43.1; 219/121 LM, 121 LJ; 156/628, 643, 644, 646, 655, 659.1, 668, 904; 204/192.32, 192.36

[56] References Cited

U.S. PATENT DOCUMENTS 4,417,393 11/1983 Becker ............... 29/846
4,417,948 11/1983 Mayne-Banton et al. ............... 156/643
4,508,749 4/1985 Brannon et al. ............... 427/43.1

OTHER PUBLICATIONS

Jubb, Charles, "PC Board Layout Via AutoCAD", *Cadence,* vol. 1, No. 2, pp. 51–55.

Angell, Richard, "End-to-End Design", *PC Tech Journal,* vol. 4, No. 11, Nov. 1986, pp. 97–119.
Clark, R. J. and Nakagawa, T., "The STD Process–New Developments and Applications", Abstract from the 1974 Microelectronics Symposium held Oct. 1974, pp. 131–144.
*High Technology,* Oct. 1986, p. 55.
"Embedding ICs in Plastic Cuts Interconnect Space", Electronics, Jun. 9, 1986, pp. 17 and 20.
Hennpenheimer, T. A., "Monster Chips", *Popular Science,* pp. 104, 106, 108 and 110.

*Primary Examiner*—William A. Powell
*Attorney, Agent, or Firm*—Lawrence D. Cutter; James C. Davis, Jr.; Marvin Snyder

[57] ABSTRACT

A method for producing holes in a polymer film includes the steps of irradiating a spot on the film with a burst of focused laser energy at a level sufficient to damage the film without puncturing it and then subsequently plasma etching the irradiated film so as to remove the damaged portions. This method is particularly applicable to the formation of multichip integrated circuit packages in which a plurality of microcircuit chips are affixed to an underlying substrate which is coated with a polymer film covering the chips and the substrates. The holes are provided for the purpose of interconnecting the chips or making intrachip connections by means of a subsequently applied metallization layer.

12 Claims, 5 Drawing Figures

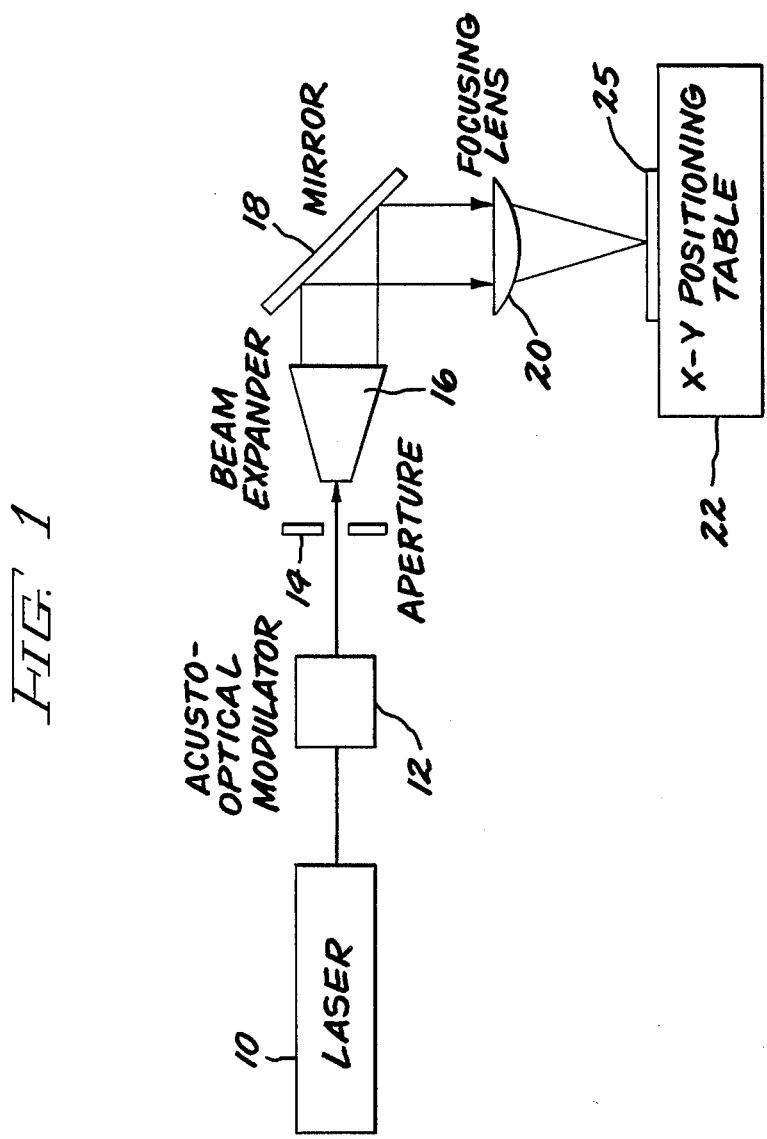

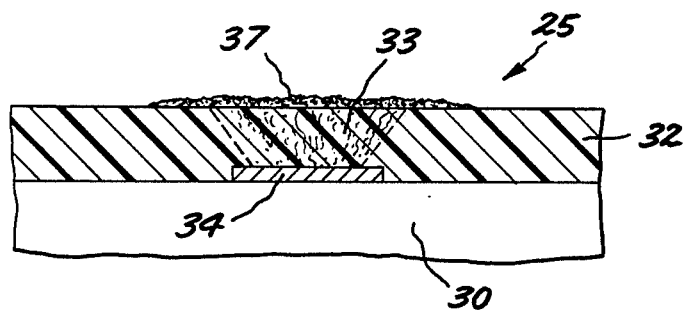
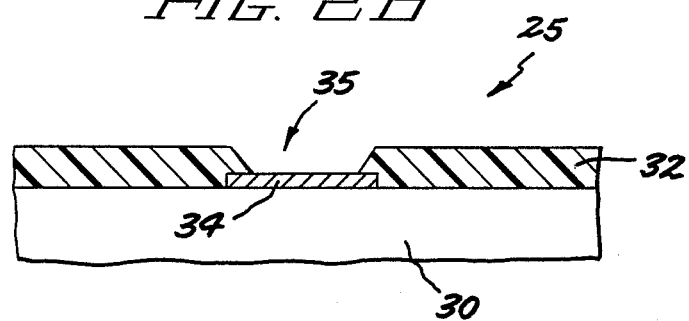

METHOD TO PRODUCE VIA HOLES IN POLYMER DIELECTRICS FOR MULTIPLE ELECTRONIC CIRCUIT CHIP PACKAGING

BACKGROUND OF THE INVENTION

The present invention is generally directed to a method and apparatus for producing via holes in polymer dielectrics without the use of a mask. More particularly, the present invention is related to a packaging method for electronic integrated circuit chips, particularly very large scale integrated circuit (VLSI) devices. The method and apparatus of the present invention produces via openings in a polymer film overlay and thereby provides a means for electrically connecting, through the vias formed, a plurality of circuit chips disposed on a substrate. It is also noted that the present invention provides significant advantages in a system of microchip packaging.

In the packaging of very large scale integrated circuit devices, a great deal of space is taken up by mechanisms for interconnecting one chip to an adjacent device. This makes the packaging of integrated circuit devices and electronic components based thereon larger than necessary. As a result of this, many individuals are involved in the development of so-called wafer-scale integration processes. However, the efforts expended in these directions have generally tended to be limited by the problem of yield. Because a certain number of chips or dies on a wafer are often found to be defective, the number of wafers that are produced that are completely usable is generally lower than is desirable. Furthermore, there still exists the problem of interconnecting the various chips on a wafer and the concomitant problem of testing a large system such as results when a number of highly complicated individual integrated circuit components are interconnected. Accordingly, it is seen that it would be very desirable to be able to construct wafer-scale integrated circuit packages from individual, easily testable integrated circuit chips. It is to this end that the present invention is directed.

More particularly, the present invention is directed to a method and apparatus for producing via openings in a polymer film overlay. This film typically covers a plurality of integrated circuit chips disposed adjacent to one another on an underlying substrate. The polymer film provides an insulative layer to facilitate interconnection of these individual circuit chips through the via openings produced in accordance with the present invention. Furthermore, a significant advantage of the system described is the ability to remove one or more of these interconnection layers so as to provide a multitude of arrangement and testing capabilities. It is noted also that the method of the present invention is also applicable even if only a single chip is present.

Polymer dielectrics are finding increased use in multichip packaging approaches because such dielectrics are easily applied at low temperatures and they result in relatively thick coatings having a low dielectric constant. More particularly, the problem addressed by the present invention is the production of holes in such polymer layers for the purpose of connecting metallization on the top of the polymer to metallization under the polymer dielectric. In the case of a removable polymer overlay layer, the interconnection is from chip pads under the polymer layer to interconnect metallization on top of the polymer layer.

One method for providing via holes in a polymer is to apply a metal mask to the top surface of the polymer by metal deposition. For example, a 1,000 angstrom thick layer of titanium can be applied. The titanium is then processed by photolithographic methods and holes are etched in the titanium where via holes are desired. The polymer is then etched in an oxygen plasma. The oxygen plasma does not attack the titanium, but does attack the exposed polymer. This approach has several shortcomings in many applications, including the present one. For example, holes that result would have very straight sidewalls if ion beam etching is used. Subsequent metallization over the sharp sidewall edge often results in breaks in metallization at the edge and also results in a low yield process. This process is exacerbated as thickness of the polymer is increased. Sharp sidewalls cannot be accommodated in polymer thicknesses of 12 to 25 microns. If a plasma barrel etcher is used, undercutting and a resulting "barrel" form to the via hole can result in a hole where the top of the hole is actually smaller than the middle. Such an opening cannot be metallized properly. By very careful control of the etching time, outward sloping sidewalls can be achieved but with the concomitant risk that the opening will not go completely through the polymer and leave a clean bottom surface for electrical connection. Finally, such processes involve a substantial number of steps: depositing the metal mask which involves first cleaning the polymer for good adhesion then depositing a photoresist, drying the resist, exposing the resist, developing the resist, hard-baking the resist, then etching holes in the metal mask. This is followed by a carefully controlled plasma etch step which is highly dependent on the temperature of the etchant and gas pressures. Additionally, the metal mask layer must be removed in order to assure good adhesion between the conductor metallization which is to be applied next and the polymer. Finally, the metal mask which is applied is opaque. This rules out the possibility of using a vision system to identify pad positions on chips and then to adaptively define the via hole position. This ability is extremely desirable in high density interconnect methods which involve a polymer overlay layer. In such methods, the chips are placed on the substrate with relatively low accuracy. A manual or automated scan system identifies the actual pad positions and slightly modifies the original artwork to match the actual pad positions. It is a problem to have a system in which the pads cannot be seen because the mask used is opaque. An additional problem using an etch mask occurs if there are pinholes, either in the mask or in the resist. In either case, the result is unwanted via openings.

An alternative approach to forming via openings is to spin or spray polyimide on a substrate and only partially cure the polyimide. Subsequently, the polyimide is coated with a photoresist and the resist is developed. In the partially cured state, the polyimide is also attacked by the developer and via holes can be etched in thin films of polyimide. This process is not satisfactory for thick films of polyimide since entrapped water vapor in the polymer cannot escape. The limit on this process is a thickness of 5 microns. In addition, this process could not be used to produce an overlay layer across the space between two chips since there is no supportive film involved in spraying or spin methods. Photosensitive polyimides are becoming available, but they suffer the same problems of thickness and inability to provide a continuous film across two chips.

A method which can be used to provide via openings through relatively thick layers of polymer involves patterning the lower layer of metallization and building up by electroplating the areas where vias are desired. This essentially leaves pillars of conductor material where the via is desired. Polymer material is them sprayed or spun on the substrate in multiple coats with sufficient curing between coats to allow solvent and byproducts of the curing process to escape. Enough coats are built up to completely cover the conductors, but to barely cover the via pillars. Short etch or even mechanical lapping is sufficient to uncover the top surface of the via pillars. While this method results in a planar surface, it involves a large number of steps and, again, cannot be used where an overlay layer must bridge a gap between two chips.

In addition to the problems associated with the approaches described above for providing via holes, it is noted that these processes cannot be achieved without the use of wet processing; that is, wet chemistry must be employed for developing a photoresist for etching of the mask or for the plating of the via areas. A distinguishing characteristics of the disclosed invention is that it is achieved using a plasma etch, which is a dry process.

The use of lasers for drilling holes is another method employed to provide vias. Typically, a laser is used in a pulse mode to evaporate material wherever the laser energy is concentrated. Very short pulses heat the material to the point that it vaporizes. This approach, however, is not satisfactory for providing via holes in the circumstances contemplated herein. First, in such methods, the underlying pads are damaged by energy which is sufficient to vaporize the polymer. It is unacceptable to damage the underlying pads. Second, the process is relatively slow in that several pulses are required. In an interconnect system, a large number of holes is required so that slow processes are again unacceptable.

SUMMARY OF THE INVENTION

In accordance with a preferred embodiment of the present invention, a method for producing via holes in the polymer film comprises the following steps. First, a spot on the film is irradiated where the hole is desired by means of a short focused burst of electromagnetic energy at a level sufficient to damage the film but without substantially ablating the film. This is preferably accomplished by means of a laser. Subsequent to the irradiation, the film is plasma etched so as to remove the film damaged by irradiation. The plasma etching also serves second purpose, namely that of preparing the rest of the film surface for subsequent application of a metallization layer. This method is particularly useful for films between about 5 and about 50 microns in thickness.

Accordingly, it is an object of the present invention to provide a method for directly forming via holes which method requires a minimum number of processing steps.

It is yet another object of the present invention to provide a method for directly forming via holes which does not require an etch mask.

It is a still further object of the present invention to provide a method of directly forming via holes which can be achieved completely with dry processing methods.

Still another object of the present invention is to provide a method for directly forming via holes in a polymer in which the underlying pads to be connected can be seen during processing for inspection and alignment.

A still further object of the present invention is to provide a method for directly forming via holes which is compatible with polymer overlay interconnect methods; that is a method which is compatible with the use of polymer films.

Yet another object of the present invention is to provide a method of directly forming via holes using a laser in which the underlying pads are inherently undamaged and where processing speeds are faster than can be achieved using multiple pulse laser methods.

It is still another object of the present invention to facilitate the utilization of electronic circuit chips containing cell libraries which are integrated in a customized form, as by a layer of metallization interconnection covering a "cell library" chip.

Lastly, but not limited hereto, it is an object of the present invention to facilitate the interconnection of multiple electronic circuit chip packages affixed to a substrate and covered by a polymer film bridging the chips.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 1 is a schematic side elevation view of an apparatus for carrying out the method of the present invention;

FIG. 2A is a cross-sectional side elevation view illustrating the results of an irradiating step carried out in accordance with the present invention;

FIG. 2B is a view similar to FIG. 2A illustrating the results of the present invention following a plasma etching step;

DETAILED DESCRIPTION OF THE INVENTION

Figure 3A:
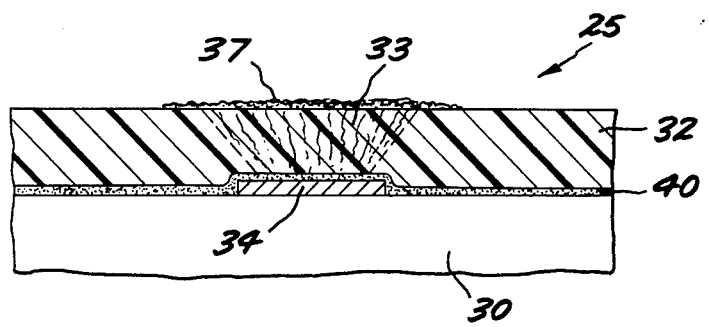
FIGS. 3A and 3B are similar to FIGS. 2A and 2B respectively, except that they particularly illustrate the utilization of an adhesive material for bonding a polymer film to an underlying substrate.

FIG. 1 illustrates the essential parts of a laser system for directly forming via holes in accordance with a preferred embodiment of the present invention. In FIG. 1 there is shown laser 10 which preferably comprises an argon ion laser operated in the optical range from approximately 350 to 370 nanometers. It has been found that ultraviolet radiation provides better shaped via holes than visible light for the purposes of the present invention. The output of laser 10 passes through acousto-optic modulator 12. The modulator deflects the laser light by a small angle when radio frequency energy is applied to the modulator. Aperture 14 mounted approximately 1 meter away either intercepts or passes the laser light depending upon the angle determined by modulator 12. In this way, the laser can be turned on and off to form short pulses at appropriate times. After light from laser 10 passes through aperture 14, it is preferably expanded by beam expander 16 to a diameter of approximately 1 centimeter. The expanded beam prevents diffraction effects from limiting the spot size to too large of a spot. After deflection by mirror 18, focus lens 20 is used to focus the laser energy to a small spot. In this embodiment, a spot of 8 microns in diameter is typically used. The substrate where the via openings are to be fabricated is placed on x-y table 22 so that the substrate can be moved, so that the focused laser spot falls in the area on workpiece 25 where the via hole is desired.

FIGS. 2A and 2B illustrate the results of the process steps in accordance with the present invention. In particular, FIG. 2A shows dielectric film 32 deposited over conductive pad 34 on substrate 30. It should be borne in mind that while FIGS. 2 and 3 indicate only conductive micropad 34 as part of the underlying structure of substrate 30, that in reality, in the situations contemplated by the present inventors, substrate 30 and micropad 34 actually are generally a part of a much more complicated microchip structure. It is important to note this because via openings formed solely by laser drilling, if misplaced or overpowered, could damage chip components.

FIG. 2A particularly shows polymer film 32 overlying connecting pad 34. In particular, "damaged" area 33 has resulted from application of focused electromagnetic radiation in accordance with the present invention. Note also the possible presence of debris 37 on the surface of dielectric 32 and potentially in the immediate vicinity of the damaged area 33. FIG. 2B illustrates the structure that results when the structure in FIG. 2A is processed by plasma etching. Note that the damaged area has been completely cleaned out of any material down to connection pad 34, thus leaving via opening 35. Note also that polymer layer 32 has been somewhat thinned. Finally, note that any debris 37 formed by laser activity has also been cleaned away and, in fact, the top surface of dielectric 32 has been plasma cleaned and is now ready for metallization. It should be pointed out that the step of plasma etching of a polymer is really performing two actions at the same time: that of cleaning the damaged area to produce via opening 35 and that of cleaning the surface of polymer 32 to prepare it for accepting a metallization layer. As was indicated above, one object of the present invention is to reduce the total number of processing steps. It is seen that the only processing steps involved to form the via openings are the laser exposure followed by a cleaning step in a plasma etcher, which is normally required in order to achieve optimal metal adhesion anyway.

Figure 3B:
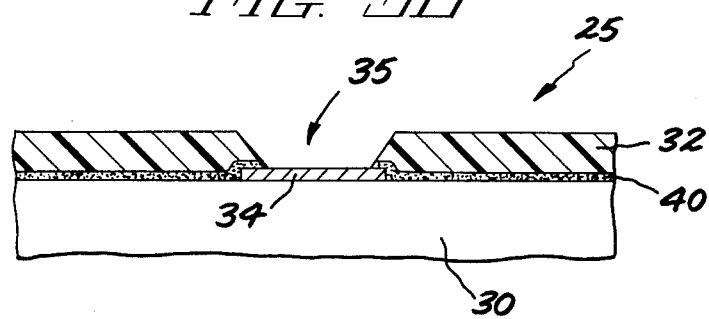

FIGS. 2A and 2B show a single polymer layer over connection pad 34. This polymer layer may comprise ULTEM TM, polymer resin (as sold by the General Electric Company) polysulfone, XYDAR TM (as sold by Dart Company) polyimide, MYLAR TM plastic (as sold by Dupont de Nemours Company, Inc.) epoxy or virtually any polymer which can be deposited. An alternate configuration involves depositing adhesive layer 40 with subsequent lamination of dielectric polymer 32. In an exemplary embodiment, ULTEM TM thermoplastic resin is sprayed from a solvent carrier onto integrated circuit chips mounted on a substrate. Solvent is driven off at a temperature of 300° C. for two minutes. KAPTON TM polyimide (as sold by the Dupont de Nemours Company, Inc.) is etched in a plasma etcher and laminated to the top surface of the integrated circuit chip using a pressure of approximately 50 pounds per square inch and a temperature of 260° C. FIG. 3A shows the system after application of focused laser energy. FIG. 3B shows a cross-section of the system after etching in an oxygen plasma. This system, shown in FIG. 3, is representative of a polymer layer used for high density interconnection. In the cross-section of FIG. 3, as in FIG. 2, note that no damage has occurred to pad 34, which typically comprises aluminum. Note also that the profile of the sidewall is gently sloping so that subsequent metallization deposited over the surface deposits in such a way as to make good electrical connection from the contact pad to metal disposed on the top surface of the polymer. This is a unique and important attribute of the present method.

The laser energy causes damage essentially according to a gaussian distribution so that as plasma etching occurs, the hole has essentially a gaussian shape. As etching continues, the hole is formed with a sidewall having a slope of between approximately 45° to 60° of slope and is an ideal shape for deposition of metal.

EXAMPLE 1

A test substrate was prepared by coating glass slides with a 1,000 angstrom thick sputter coat of chrome, followed by a 10,000 angstrom thick layer of aluminum. This simulates a metallization system on an integrated circuit chip. Test substrates were sprayed with a 10% ULTEM TM resin solution according to the following formulation: 26 grams of ULTEM TM 1000 resin premixed with 104 grams of methylene chloride and then mixed with 155 grams of acetophenone. The sprayed substrates were dried for 1 minutes at 140° C. on a hot plate and subsequently reflowed at a temperature of 360° C. for a period of 3 minutes. A second coat of ULTEM TM resin was sprayed on the substrate and the same baking procedure followed. A 1 mil thick KAPTON TM H film was etched in a plasma etcher on one side only for a period of 10 minutes at a power level of 500 watts. A mixture of 50% oxygen and 50% $CF_4$ was used at a total pressure of 0.4 torr. The resulting KAPTON TM thickness film was approximately 15 microns. The film was laminated (with the etch side down) down to the adhesive coated glass substrate. Lamination conditions were 50 pounds per square inch at a temperature of 280° C. for a period of approximately 2 minutes at this temperature. Samples were cooled to a temperature of 150° C. before removal from the laminator. Several tests were run using these samples. In the first test the energy from the laser system as described in FIG. 1, was focused to a spot of 8 microns in diameters with various power levels and pulse lengths used. Also, various laser frequencies were used. Table 1 below shows a tabulation for ultraviolet, 488 nanometer (nm) blue and 514 nanometer green frequency lines. The table lists the power and pulse length and the resulting hole diameter at the top of the hole and at the bottom of the hole. All samples were etched after laser exposure at a power level of 400 watts in a 50% oxygen and 50% $CF_4$ plasma at a pressure of 0.4 torr using a Branson IPC 2000 barrel etcher for about 9 minutes.

TABLE 1

| Laser Line in Wavelengths | Laser Output Power in Watts | Pulse Length in Microseconds | Hole Diameter in μm | |
|---|---|---|---|---|
| | | | Top | Bottom |
| 514 nm | 2.0 | 10,000 | 90 | 40 |
| | | 1,000 | 43 | 33 |
| | | 100 | not through | |
| 514 nm | 0.5 | 10,000 | 65 | 31 |
| | | 1,000 | 28 | 9 |
| | | 100 | not through | |

TABLE 1-continued

| Laser Line in Wavelengths | Laser Output Power in Watts | Pulse Length in Microseconds | Hole Diameter in μm | |
|---|---|---|---|---|
| | | | Top | Bottom |
| 488 nm | 1.5 | 10,000 | 80 | 61 |
| | | 1,000 | 34 | 26 |
| | | 100 | 27 | 10 |
| 488 nm | 0.4 | 10,000 | 49 | 14 |
| | | 1,000 | 24 | 10 |
| | | 100 | 21 | 8 |
| UV 351, 368 nm | 0.4 | 10,000 | 51 | 24 |
| | | 1,000 | 33 | 15 |
| | | 100 | 14 | 6 |

EXAMPLE 2

In this example, glass substrates were prepared as in Example 1. This time, various materials were applied to the substrates to obtain a polymer thickness between about 12 and 25 microns. The materials used were an epoxy resin cured using a 2% by weight sulfonium salt curing agent with a curing time of 15 minutes at 150° C. The epoxy used was ERL4221, epoxy resin from CIBA GEIGY. A second material used was ULTEM TM resin sprayed from the solvent in Example 1 and using the same baking schedule as Example 1, except that 5 coats were applied to give a thickness of 15 microns. Finally, a sample of polysulfone was prepared using Union Carbide UDEL TM 1,000 resin in a solvent of THF (tetrahydrofuran; 10% by weight). Four coats were sprayed and dried according to the same procedure as the baking schedule of Example 1. Table 2 shows the pulse length and power level and the resultant hole size after an etch of 9 minutes in a plasma of 50% oxygen and 50% CF₄ at a power level of 400 watts. Note the different laser power levels required to obtain approximately the same hole size but note also that a large selection of polymer materials have been shown to work according to the method of via hole formation disclosed.

TABLE 2

| Material | Laser Frequency | Power | Pulse Length in Microseconds | Hole Diameter in μm | |
|---|---|---|---|---|---|
| | | | | Top | Bottom |
| Epoxy | 351 n | 0.4 W | 500 | 45 | 25 |
| ULTEM TM | 351 nm | 0.4 W | 1 000 | 33 | 15 |
| UDEL TM | 3451 nm | 0.4 W | 10 000 | 20 | 80 |

EXAMPLE 3

Test samples were also prepared as in Example 1 except that a 1 mil thick KAPTON TM film was etched for only 5 minutes resulting in a thickness of 0.9 mils. These samples were exposed to the focused laser energy for 10,000 microseconds at a laser output power of 0.3 watts. The samples were then placed in a barrel etcher under the following conditions: 300 watts for 15 minutes in pure oxygen at a pressure of 0.5 torr. This resulted in a clean pit being created where laser energy had been focused. The diameter of the pit was 50 microns and the depth was 12 microns. The thickness of the KAPTON TM film was essentially unchanged. This shows that a very high etch ratio can be obtained in a pure oxygen plasma.

EXAMPLE 4

The samples of Example 3 were exposed to a second irradiation of focused laser energy for 10,000 microseconds. The samples were again placed in a barrel etcher under the same time and power conditions as in Example 3. This time holes were produced which went completely through the KAPTON TM and ULTEM TM films to the aluminum material beneath. The holes were 50 microns at the top and approximately 30 microns at the bottom. The total thickness of 30 microns (KAPTON TM and ULTEM TM) was unchanged. This demonstrates the ability to tailor holes in depth and shape by multiple cycles of laser energy and plasma etching.

From the above, it should be appreciated that all of the aforementioned objects are achieved by the process of the present invention. In particular, it is seen that a dry chemical process having few steps is described for accurately producing via holes in polymer films. In particular, it is seen that the method of the present invention is particularly usable with polymer materials which are capable of bridging multiple integrated circuit chips affixed to a common substrate. It is also seen that the method of the present invention not only produces holes of the desired size, shape and position, but also prepares the surface of the polymer material for subsequent application of metallization line patterns for interconnecting contact pads both between chips and on the same chip.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for producing holes in a polymer film, said method comprising the steps of:
   irradiating a spot on said film, where said hole is desired, with a burst of focused electromagnetic energy at a level sufficient to damage said film without substantial ablation of said film; and
   plasma etching said irradiated film so as to remove said damaged film.

2. The method of claim 1 in which said electromagnetic energy is produced by a laser.

3. The method of claim 2 in which said laser is an argon ion laser.

4. The method of claim 2 in which said laser operates in the ultraviolet region.

5. The method of claim 1 in which said etching occurs at a pressure of approximately 0.5 torr.

6. The method of claim 5 in which said electromagnetic energy is focused to a spot of approximately 8 microns in diameter.

7. The method of claim 1 in which said film is from approximately 5 to approximately 50 microns in thickness.

8. The method of claim 2 in which said laser is controlled by an acousto-optical modulator.

9. The method of claim 2 in which said electromagnetic laser energy passes through a beam expander and a focusing lens respectively, prior to impingement upon said film.

10. The method of claim 1 in which said polymer film is selected from the group consisting of polysulfone, polyimide, polyethylene teraphthalate and epoxy.

11. The method of claim 1 in which said etching occurs in an oxygen atmosphere.

12. The method of claim 1 in which said etching occurs in an atmosphere comprising approximately 50% oxygen and 50% CF₄.

* * * * *